United States Patent
Yamashina et al.

(10) Patent No.: US 9,815,978 B2
(45) Date of Patent: Nov. 14, 2017

(54) LIGHT DIFFUSER AND LUMINAIRE

(71) Applicant: PANASONIC INTELLECTUAL PROPERTY MANAGEMENT CO., LTD., Osaka (JP)

(72) Inventors: Daigo Yamashina, Osaka (JP); Shuhei Uchiyama, Osaka (JP); Satoru Yamauchi, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/467,164

(22) Filed: Mar. 23, 2017

(65) Prior Publication Data
US 2017/0275445 A1  Sep. 28, 2017

(30) Foreign Application Priority Data
Mar. 28, 2016 (JP) .................. 2016-062982

(51) Int. Cl.
| | |
|---|---|
| *H01L 33/00* | (2010.01) |
| *F21V 11/00* | (2015.01) |
| *C08L 33/00* | (2006.01) |
| *H01L 33/58* | (2010.01) |
| *C09D 133/00* | (2006.01) |
| *C09D 7/12* | (2006.01) |

(Continued)

(52) U.S. Cl.
CPC ............ *C08L 33/00* (2013.01); *C09D 7/1283* (2013.01); *C09D 7/1291* (2013.01); *C09D 133/00* (2013.01); *F21V 9/00* (2013.01); *F21V 9/02* (2013.01); *F21V 9/04* (2013.01); *F21V 9/06* (2013.01); *F21V 29/87* (2015.01); *G02B 1/04* (2013.01); *G02B 5/0242* (2013.01); *G02B 5/0278* (2013.01); *H01L 33/52* (2013.01); *H01L 33/54* (2013.01); *H01L 33/56* (2013.01); *H01L 33/58* (2013.01); *C08L 2203/20* (2013.01); *C08L 2205/025* (2013.01); *C08L 2205/14* (2013.01); *C08L 2205/22* (2013.01); *F21Y 2115/10* (2016.08)

(58) Field of Classification Search
None
See application file for complete search history.

(56) References Cited

U.S. PATENT DOCUMENTS

| | | | |
|---|---|---|---|
| 6,791,259 B1 * | 9/2004 | Stokes | ............... C09K 11/7734 257/98 |
| 2013/0083544 A1 | 4/2013 | Hosoda et al. | |

(Continued)

FOREIGN PATENT DOCUMENTS

JP  2011-209658 A  10/2011

*Primary Examiner* — Minh-Loan Tran
(74) *Attorney, Agent, or Firm* — Greenblum & Bernstein, P.L.C.

(57) ABSTRACT

A light diffuser includes: a thermoplastic resin base which has a thermal expansion coefficient of at least $4\times10^{-5}$/K and at most $8\times10^{-5}$/K; and a light diffusion layer which is disposed on a surface of the thermoplastic resin base and includes an acrylic resin film and an acrylic resin particle, the acrylic resin film including one or more acrylic resins having a glass transition temperature of at least 30° C. and at most 50° C., the acrylic resin particle being included in the acrylic resin film and having an average particle size of at least 1 μm and at most 15 μm.

8 Claims, 2 Drawing Sheets

(51) Int. Cl.
*G02B 5/02* (2006.01)
*G02B 1/04* (2006.01)
*F21V 29/87* (2015.01)
*F21V 9/00* (2015.01)
*H01L 33/54* (2010.01)
*F21V 9/02* (2006.01)
*H01L 33/56* (2010.01)
*H01L 33/52* (2010.01)
*F21V 9/04* (2006.01)
*F21V 9/06* (2006.01)
*F21Y 115/10* (2016.01)

(56) References Cited

U.S. PATENT DOCUMENTS

2013/0141891 A1* 6/2013 Funakubo ............... F21V 21/00
362/84
2014/0029238 A1* 1/2014 Ito ........................... F21V 9/00
362/84

* cited by examiner

LIGHT DIFFUSER AND LUMINAIRE

CROSS REFERENCE TO RELATED APPLICATION

This application claims the benefit of priority of Japanese Patent Application Number 2016-062982 filed on Mar. 28, 2016, the entire content of which is hereby incorporated by reference.

BACKGROUND

1. Technical Field

The present disclosure relates to a light diffuser having light transmission properties, light diffusion properties, and thermal endurance. Moreover, the present disclosure relates to a luminaire including the light diffuser having the light transmission properties, the light diffusion properties, and the thermal endurance.

2. Description of the Related Art

In recent years, light-emitting diode (LED) luminaires including an LED as a light source have become popular. The LED light source is a point light source and has high directivity. Consequently, a light diffuser used as the lighting cover of an LED luminaire is required to have concealing characteristics for a light source image which avoid recognition as the point light source, in addition to the light transmission properties which conventional luminaries are required to have, in other words, as compared to luminaires including a conventional fluorescent lamp as a light source, the light diffuser used for the LED luminaire including the LED as the light source is required to have greater light diffusion properties.

Conventionally known is a light diffusion film which includes particles and binders on a surface of base and in which an internal diffusion layer and a surface shape layer are disposed with an aim to achieve both light transmission properties and light diffusion properties. (See Patent Literature (PTL) 1 (Japanese Unexamined Patent Application Publication No. 2011-209658), for example.)

SUMMARY

However, the lighting cover used for the luminaire is close to the light source, and a temperature rises due to irradiation of light from the light source. For this reason, in the light diffuser used as the lighting cover, a coated film disposed on the surface of the base and having the light diffusion properties is likely to separate due to a difference in thermal expansion between the base and the coated film.

In view of this, the present disclosure provides: a light diffuser in which adhesion between a thermoplastic resin base and a light diffusion layer which is a coated film having the light diffusion properties is higher than before, and the light diffusion layer has greater hardness and scratch resistance than before; and a luminaire including the light diffuser.

A light diffuser according to one aspect of the present disclosure includes: a thermoplastic resin base which has a thermal expansion coefficient of at least $4\times10^{-5}$/K and at most $8\times10^{-5}$/K; and a light diffusion layer which is disposed on a surface of the thermoplastic resin base and includes an acrylic resin film and an acrylic resin particle, the acrylic resin film including one or more acrylic resins having a glass transition temperature of at least 30° C. and at most 50° C., the acrylic resin particle being included in the acrylic resin film and having an average particle size of at least 1 μm and at most 15 μm.

Moreover, a luminaire according to one aspect of the present disclosure includes: a light diffuser; and a light-emitting diode (LED) light source, wherein the LED light source is disposed on a side of a thermoplastic resin base of the light diffuser, having a light-emitting face of the LED light source face the thermoplastic resin base.

Furthermore, a luminaire according to another aspect of the present disclosure includes: a light diffuser; and a light-emitting diode (LED) light source, wherein the LED light source is disposed on a side of a light diffusion layer of the light diffuser, having a light-emitting face of the LED light source face the light diffusion layer.

With the light diffuser and the luminaire according to the present disclosure, by specifying the thermal expansion coefficient of the thermoplastic resin base and the glass transition temperature of the acrylic resin included in the acrylic resin film, it is possible to reduce a separation of the acrylic resin film due to heat and form the acrylic resin film having superior durability. Moreover, by including acrylic resin particles in the acrylic resin film, it is possible to reduce a difference in refractive index of an interface between the acrylic resin film and the acrylic resin particles.

BRIEF DESCRIPTION OF DRAWINGS

The figures depict one or more implementations in accordance with the present teaching, by way of examples only, not by way of limitations. In the figures, like reference numerals refer to the same or similar elements.

DETAILED DESCRIPTION OF THE EMBODIMENTS

Exemplary embodiments of the present disclosure will be described below with reference to the drawings. It is to be noted that the exemplary embodiments described below each show a specific example. The numerical values, shapes, materials, structural components, the placement and connection of the structural components, steps, the processing order of the steps, etc. shown in the following exemplary embodiments are mere examples, and are not intended to limit the scope of the present disclosure. Furthermore, among the structural components in the following exemplary embodiment, components not recited in any one of the independent claims which indicate the broadest concepts of the present disclosure are described as optional structural components.

The respective figures are schematic diagrams and are not necessarily precise illustrations. Furthermore, in the respective figures, substantially identical components are assigned the same reference signs, and overlapping description is omitted or simplified.

Embodiment

[Light Diffuser]

Figure 1:
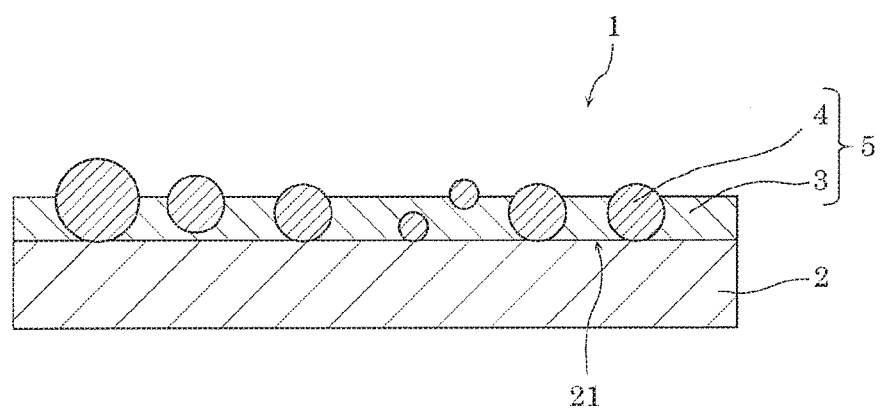
FIG. 1 is a schematic sectional view illustrating a light diffuser according to an embodiment of the present disclosure.

Light diffuser (light diffusion plate) 1 according to an embodiment of the present disclosure will he described with reference to FIG. 1. FIG. 1 is a schematic sectional view illustrating light diffuser 1 according to the embodiment of the present disclosure.

As illustrated in FIG. 1, light diffuser 1 includes thermoplastic resin base 2 and light diffusion layer 5. Light diffusion layer 5 is formed on one surface 21 of thermoplastic resin base 2. Moreover, light diffusion layer 5 includes: acrylic resin film 3 including at least one or more acrylic resins; and acrylic resin particles 4 included in acrylic resin film 3.

As an example, the acrylic resin included in acrylic resin film 3 relay be an acrylic resin of one kind or acrylic resins of at least two kinds.

Here, acrylic resin film 3 may have a film thickness less than an average particle size of acrylic resin particles 4. In doing so, some of acrylic resin particles 4 are allowed to easily protrude from a surface of acrylic resin film 3. Consequently, irregularities are formed on a surface of light diffusion layer 5, which improves light diffusion properties.

Moreover, in light diffusion layer 5, 10 to 300 parts by mass of acrylic resin particles 4 may be preferably included or 20 to 100 parts by mass of acrylic resin particles 4 may be more preferably included with respect to a total of 100 parts by mass of the acrylic resin included in acrylic resin film 3. If acrylic resin particles 4 are too few, light diffuser 1 cannot obtain sufficient light diffusion properties. On the other hand, if acrylic resin particles 4 are too many and excessive, adhesion between thermoplastic resin base 2 and acrylic resin film 3 and durability of light diffusion layer 5 are reduced.

Hereinafter, materials of thermoplastic resin base 2, acrylic resin film 3, and acrylic resin particles 4 will be described in detail.

In the embodiment, thermoplastic resin base 2 has a thermal expansion coefficient of at least $4\times10^{-5}$/K and at most $8\times10^{-5}$/K, and the acrylic resin included in acrylic resin film 3 has a glass transition temperature (Tg) of at least 30° C. and at most 50° C. By combining thermoplastic resin base 2 and acrylic resin film 3, the adhesion between thermoplastic resin base 2 and acrylic resin film 3 is increased, and the hardness and durability such as scratch resistance of light diffusion layer 5 are increased. This is because it is considered that the hardness of a surface of a coated film is reduced when Tg is less than 30° C., which reduces wear resistance, and the adhesion is reduced when Tg is greater than 50° C.

A material of thermoplastic resin base 2 is not particularly limited as long as the material has the thermal expansion coefficient of at least $4\times10^{-5}$/K and at most $8\times10^{-5}$/K and the light transmission properties. Here, having the light transmission properties means being transparent or translucent, and it is sufficient that at least a total light transmittance is greater than or equal to 70%.

Specific examples of the material of thermoplastic resin base 2 include polycarbonate (PC), methacrylic-styrene copolymer (MS), polyamide (PA), polychloratrifluoroethylene (PCTFE), polystyrene (PS), and acrylonitrile-styrene copolymer (AS). From a standpoint of thermal resistance, costs, proccessability, and optical property, it is particularly desirable that thermoplastic resin base 2 include polycarbonate among these examples.

For reference, Table 1 shows the thermal expansion coefficient of each of the materials.

TABLE 1

| Type of thermoplastic resin base | Thermal expansion coefficient ($\times 10^{-5}$/K) |
|---|---|
| Polycarbonate (PC) | 6.6 |
| Methacrylic-styrene copolymer (MS) | 6-8 |
| Polyamide 66 (PA) | 8 |
| Polychlorotrifluoroethylene (PCTFE) | 4.5-7 |
| Polystyrene (PS) | 6-8 |
| Acrylonitrile-styrene copolymer (AS) | 6-8 |

In the embodiment, an acrylic resin included in acrylic resin film 3 is not particularly limited as long as the acrylic resin has a glass transition temperature of at least 30° C. and at most 50° C. Moreover, acrylic resin film 3 may include an acrylic resin of one kind having the glass transition temperature of at least 30° C. and at most 50° C. or acrylic resins of at least two kinds.

The acrylic resin having the glass transition temperature of at least 30° C. and at most 50° C. is a polymer substance of monomers of one or more kinds having carbon-carbon double bonds. Specific examples of the monomers include a (meth)acrylate monomer, a styrene monomer, an olefin monomer, and a vinyl monomer.

More specifically, examples of the (meth)acrylate monomer include methyl (meth)acrylate, 2-ethylhexyl (meth)acrylate, isobornyl (meth)acrylate, glycidyl (meth)acrylate, benzyl (meth)acrylate, stearyl (meth)acrylate, lauryl (meth)acrylate, and 2-hydroxy-3-phenoxyprophyl (meth)acrylate.

Moreover, examples of the styrene monomer include: alkyl substitution styrene such as styrene, 2-methyl styrene, 3-methyl styrene, 4-methyl styrene, 4-ethyl styrene, 4-t-butyl styrene, and 2,4-dimethyl styrene; α-alkyl substitution styrene such as α-methyl styrene and α-methyl-4-methyl styrene; and halogenated styrene such as 2-chlorostyrene and 4-chlorostyrene.

Furthermore, examples of the olefin monomer include ethylene and propylene. Moreover, examples of the vinyl monomer include chloroethylene and vinylidene chloride.

In the embodiment, acrylic resin particles 4 are not particularly limited as long as acrylic resin particles 4 are a particulate acrylic resin having an average particle size of at least 1 μm and at most 15 μm. In addition, acrylic resin particles 4 may include acrylic resin particles of one kind or acrylic resin particles of at least two kinds.

If acrylic resin particles 4 have an average particle size of less than 1 μm, it is not possible to obtain sufficient light diffusion properties. Moreover, if the average particle size of acrylic resin particles 4 is increased to beyond 15 μm, acrylic resin film 3 is increased in thickness because acrylic resin particles 4 are combined to solidify, and light transmission properties are reduced.

Specific examples of the particulate acrylic resin which can be included in acrylic resin particles 4 include methylene glycol, trimethylolpropane tri(meth)acrylic acid ethyl (meth)acrylic acid ethylene glycol, di(meth)acrylic acid polyethylene glycol, di(meth)acrylic acid 1,3-butylene di(meth)acrylic acid 1,4-butanediol, di(meth)acrylic acid 1,6-hexanediol, di(meth)acrylic acid neopentyl glycol, hydroxypivalic acid neopentyl glycol di(meth)acrylic acid ester, di(meth)acrylic acid polypropylene glycol, di(meth) acrylic acid polytetraester, ethoxylated trimethylolpropane tri(meth)acrylic acid ester, propoxylated trimethylolpropane tri(meth)acrylic acid ester, glycerin tri(meth)acrylic acid ester, and ethoxylated glycerin tri(meth)acrylic acid ester.

Moreover, acrylic resin particles 4 may be porous. Micropores of acrylic resin particles 4 also diffuse light because acrylic resin particles 4 are porous, which improves the light diffusion properties of light diffuser 1. In a case where acrylic resin particles 4 are porous, porous acrylic resin particles 4 may have an average micropore size of at least 10 nm and at most 100 nm.

In the embodiment, acrylic resin film 3 and acrylic resin particles 4 are combined to form light diffusion layer 5. Because acrylic resin film 3 and acrylic resin particles 4 are both made of the acrylic resin, a difference in refractive index of an interface between acrylic resin film 3 and acrylic resin particles 4 is small, and acrylic resin film 3 and acrylic resin particles 4 have superior light diffusion properties and light transmission properties than in a case where acrylic resin film 3 and acrylic resin particles 4 are made of different materials.

Hereinafter, a method for producing light diffuser 1 according to the embodiment will be described.

First, an acrylic resin to be used as acrylic resin film 3, acrylic resin particles 4, and a curing agent are mixed to form a resin composition. Furthermore, a diluting solvent is added to the resin composition to adjust a coating material of the resin composition.

Next, the coating material of the resin composition is applied to one surface 21 of thermoplastic resin base 2, and subsequently the coated film is cured by heat drying, to form light diffusion layer 5.

It is to be noted that the curing agent included in the resin composition is not particularly limited as long as the curing agent cures the acrylic resin to be used as acrylic resin film 3. Specific examples of the curing agent include a silicon resin, an isocyanate resin, and an amino resin.

It is to be noted that thermoplastic resin base 2 may have a flat plate shape or may be formed in a predetermined shape beforehand. For example, light diffusion layer 5 may be formed in thermoplastic resin base 2 formed in a dome shape.

Moreover, light diffuser 1 may include thermoplastic resin base 2 having the flat plate shape, and may be extended by vacuum forming and formed in a predetermined shape after light diffusion layer 5 is formed.

[Luminaire]

Figure 2:
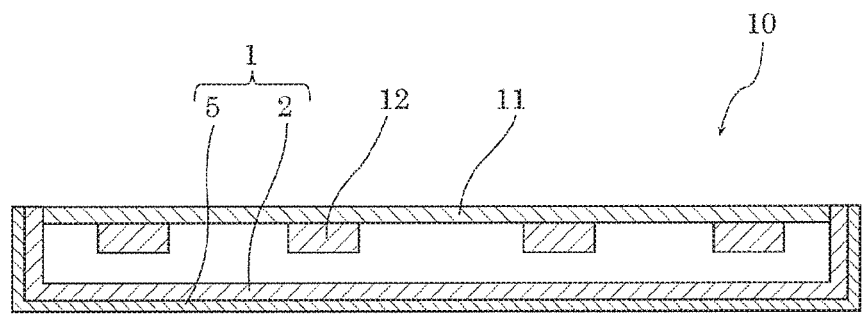
FIG. 2 is a schematic sectional view illustrating a luminaire according to the embodiment of the present disclosure.

Next, luminaire 10 according to the embodiment of the present disclosure will be described with reference to FIG. 2. FIG. 2 is a schematic sectional view illustrating luminaire 10 according to the embodiment of the present disclosure.

Luminaire 10 includes: base 11 (lighting base); LED light sources 12 disposed to base 11; and light diffuser 1 which is a lighting cover disposed to cover LED light sources 12. In the embodiment, light diffuser 1 is disposed having a surface on the side of thermoplastic resin base 2 face LED light sources 12. In other words, light-emitting faces of LED light sources 12 and a surface of thermoplastic resin base 2 of light diffuser 1 are opposite to each other.

In luminaire 10 thus configured, when LED light sources 12 emit light, light diffuser 1 is heated by being illuminated with the light from LED light sources 12. In light diffuser 1 in the embodiment, however, because thermoplastic resin base 2 has the thermal expansion, coefficient of at least $4\times10^{-5}$/K and at most $8\times10^{-5}$/K, and the acrylic resin included in acrylic resin film 3 has the glass transition temperature (Tg) of at least 30° C. and at most 50° C., the adhesion between thermoplastic resin base 2 and acrylic resin film 3 is high, and a separation of acrylic resin film 3 from thermoplastic resin base 2 is reduced even when acrylic resin film 3 is heated. Moreover, light diffusion layer 5 (acrylic resin film 3) in the embodiment has superior durability. In addition, light diffuser 1 makes it possible to efficiently diffuse (scatter) light from LED light sources 12.

Figure 3:
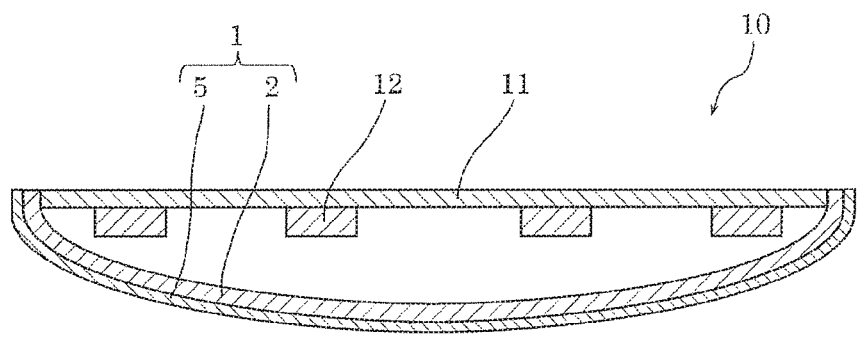
FIG. 3 is a schematic sectional view illustrating another form of the luminaire according to the embodiment of the present disclosure.

It is to be noted that although light diffuser 1 having the flat plate shape is shown in the embodiment as illustrated in FIG. 1, light diffuser 1 (lighting cover) may have the dome shape as illustrated in FIG. 3.

Moreover, although luminaire 10 including LED light sources 12 is shown in the embodiment, the number of LED light sources 12 is not limited and may be one or more.

Figure 4:
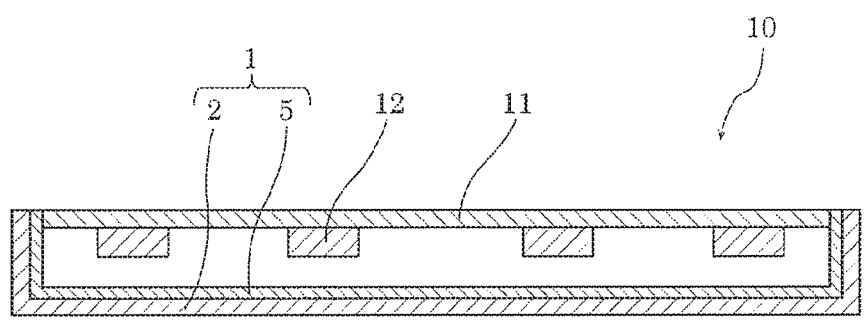
FIG. 4 is a schematic sectional view illustrating a luminaire according to a variation of the present disclosure.

Furthermore, although light diffuser 1 is disposed having the surface on the side of thermoplastic resin base 2 face LED light sources 12 in the embodiment, light diffuser 1 may be disposed having a surface of the side of light diffusion layer 5 face LED light sources 12 as illustrated in FIG. 4. In other words, the light-emitting faces of LED light sources 12 and the surface of light diffusion layer 5 of light diffuser 1 are opposite to each other in FIG. 4. It is to be noted that as illustrated in FIG. 3, light diffuser 1 (lighting cover) may have the dome shape in FIG. 4.

EXAMPLES

Next, examples of light diffuser 1 according to the embodiment and comparative examples will be described.

Example 1

An acrylic resin having a glass transition temperature of 30° C. (ACRYDIC A-9510 made by DIC Corporation) is used as the acrylic resin included in acrylic resin film 3, and cross-linked polymethylmethacrylate porous spherical particles having an average particle size of 8 μm and a micropore size of 20 nm (MBP-8 made by Sekisui Plastics Co., Ltd.) are used as acrylic resin particles 4. Moreover, a hydrolysable silyl-containing silicon compound (ACRYDIC FZ-523 made by DIC Corporation) is used as the curing agent. Furthermore, polycarbonate (lupilon H-4000 made by Mitsubishi Engineering-Plastic Corporation) is used as thermoplastic resin base 2.

First, 20 parts by mass of the curing agent and 50 parts by mass of acrylic resin particles 4 are mixed with respect to 100 parts by mass of the acrylic resin included in acrylic resin film 3, 600 parts by mass of propylene glycol monomethyl ether (made by Kanto Chemical Co., Inc.) is added as a diluting solvent to a resin composition to adjust a coating material of the resin composition.

Light diffuser 1 in which light diffusion layer 5 is formed is produced by applying the adjusted coating material of the resin composition to thermoplastic resin base 2 of polycarbonate (lupilon H-4000 made by Mitsubishi Engineering-Plastic Corporation) to form a coated film having a thickness of 6 μm, and curing the coated film by heat drying at 80° C. for 15 minutes.

Example 2

Light diffuser 1 is produced in the same manner as in Example 1, except that an acrylic resin having a glass transition temperature of 50° C. (ACRYDIC A-9540 made by DIC Corporation) is used as the acrylic resin included in acrylic resin film 3, a hydrolysable silyl-containing silicon compound (ACRYDIC FZ-521 made by DIC Corporation) is used as the curing agent, and an acrylonitrile-styrene copolymer (CEVIAN-N020 made by Daicel Polymer Ltd.) is used as thermoplastic resin base 2.

Example 3

Light diffuser 1 is produced in the same manner as in Example 1, except that a resin is used as the acrylic resin included in acrylic resin film 3, the resin being obtained by mixing, at a mass ratio of 7 to 3, the acrylic resin having the glass transition temperature of 30° C. (ACRYDIC A-9510 made by DIC Corporation) and the acrylic resin having the glass transition temperature of 50° C. (ACRYDIC A-9540 made by DIC Corporation).

Example 4

Light diffuser 1 is produced in the same manner as in Example 1, except that 100 parts by mass of acrylic resin particles 4 are mixed with respect to 100 parts by mass of the acrylic resin included in acrylic resin film 3, and the adjusted coating material of the resin composition is applied to thermoplastic resin base 2 to form a coated film having a thickness of 3 μm.

Example 5

Light diffuser 1 is produced in the same manner as in Example 1, except that 20 parts by mass of acrylic resin particles 4 are mixed with respect to 100 parts by mass of the acrylic resin included in acrylic resin film 3, and the adjusted coating material of the resin composition is applied to thermoplastic resin base 2 to form a coated film having a thickness of 10 μm.

Example 6

Light diffuser 1 is produced in the same manner as in Example 1, except that cross-linked polymethylmethacrylate non-porous spherical particles having an average particle size of 8 m (MBX-8 made by Sekisui Plastics Co., Ltd.) are used as acrylic resin particles 4.

Example 7

Light diffuser 1 is produced in the same manner as in Example 1, except that the adjusted coating material of the resin composition is applied to thermoplastic resin base 2 to form a coated film having a thickness of 20 μm.

Example 8

Light diffuser 1 is produced in the same manner as in Example 1, except that 5 parts by mass of acrylic resin particles 4 are mixed with respect to 100 parts by mass of the acrylic resin included in acrylic resin film 3.

Comparative Example 1

Light diffuser 1 is produced in the same manner as in Example 1, except that an acrylic resin having a glass transition temperature of 90° C. (ACRYDIC BZ-1160 made by DIC Corporation) is used as the acrylic resin included in acrylic resin film 3.

Comparative Example 2

Light diffuser 1 is produced in the same manner as in Example 1, except that an acrylic resin having a glass transition temperature of 15° C. (ACRYDIC A-9521 made by DIC Corporation) is used as the acrylic resin included in acrylic resin film 3 and the hydrolysable silyl-containing silicon compound (ACRYDIC FZ-521 made by DIC Corporation) is used as the curing agent.

Evaluation

Next, produced light diffusers 1 of aforementioned Examples 1 to 8 and Comparative Examples 1 and 2 are evaluated for light diffusion properties, appearance, adhesion, surface hardness, and scratch resistance.

Evaluation of Light Diffusion Properties

Light diffusers 1 of Examples 1 to 8 and Comparative Examples 1 and 2 are measured for a total light transmittance using a haze meter ("NDH2000" made by Nippon Densholtu Industries Co., Ltd.). Each measurement is performed with the side of the light diffusion layer directed toward the light sources. Because both superior luminaire efficiency and light uniformity can be said to be compatible if the total light transmittance is at least 60%, the light uniformity exists, and there is no lamp image, the following criteria are used.

Criteria
  Above 65%: 60 to 65%: II
  Below 60%: III

Evaluation of Appearance

Light diffusers 1 of Examples 1 to 8 and Comparative Examples 1 and 2 are visually checked for concealing characteristics for a light source image using Square Baselight XL524PFULT9 made by Panasonic Corporation. Light diffusers 1 each are cut out in an appropriate size (350×350 nm) for the luminaire, and each measurement is performed based on the following criteria, with the side of the light diffusion layer directed toward the light sources.

Criteria
  A: Light source shape is unidentifiable, and light emission is even.
  B: Light source shape is blur, but intervals between neighboring LED light sources are discernible.
  C: Light source shape is identifiable.

Evaluation of Primary Adhesion

Adhesion between thermoplastic resin base 2 and acrylic resin film 3 in each of light diffusers 1 of Examples 1 to 8 and Comparative Examples 1 and 2 is measured by a cross-cut adhesion test in accordance with JIS K-5600-5-6.

Evaluation of Secondary Adhesion

Light diffusers 1 of Examples 1 to 8 and Comparative Examples 1 and 2 are each soaked as a test sample in boiling water for 30 minutes, taken out of the water, and dried, and adhesion between thermoplastic resin base 2 and acrylic resin film 3 is measured by the cross-cut adhesion test in accordance with JIS K-5600-5-6.

Evaluation of Surface Hardness

Hardness of light diffusion layer 5 in each of light diffusers 1 of Examples 1 to 8 and. Comparative Examples 1 and 2 is measured in accordance with scratch hardness (pencil method) in JIS K5600 (Testing methods for paints).

Evaluation of Scratch Resistance

Light diffusion layer 5 in each of light diffusers 1 of Examples 1 to 8 and Comparative Examples 1 and 2 is abraded back and forth 10 times under a load of 100 g/cm$^2$ using a steel wool (grade code: 0000#), and the presence or absence of a scratch in a surface of the coated layer after the abrasion is evaluated. The following criteria are used.

Criteria

Yes: No scratch is visually identifiable or one scratch is identifiable.

No: Two or more scratches are identifiable.

Table 2 shows a summary of conditions for light diffusers 1 of Examples 1 to 8 and Comparative Examples 1 and 2, and Table 3 shows a result of each evaluation.

TABLE 2

|  | Glass transition temperature of acrylic resin film | Acrylic resin particle with respect to 100 parts by mass of acrylic resin film | Particle size of acrylic resin particle | Porosity | Microporosity | Film thickness | Base | Thermal expansion coefficient |
|---|---|---|---|---|---|---|---|---|
| Example 1 | 30° C. | 50 parts by mass | 8 μm | Yes | 20 nm | 6 μm | Polycarbonate | $6.6 \times 10^{-5}$/K |
| Example 2 | 50° C. | 50 parts by mass | 8 μm | Yes | 20 nm | 6 μm | Acrylon • styrene copolymer | $6.8 \times 10^{-5}$/K |
| Example 3 | 30° C. | 50 parts by mass | 8 μm | Yes | 20 nm | 6 μm | Polycarbonate | $6.6 \times 10^{-5}$/K |
| Example 4 | 30° C. | 100 parts by mass | 8 μm | Yes | 20 nm | 8 μm | Polycarbonate | $6.6 \times 10^{-5}$/K |
| Example 5 | 30° C. | 20 parts by mass | 8 μm | Yes | 20 nm | 10 μm | Polycarbonate | $6.6 \times 10^{-5}$/K |
| Example 6 | 30° C. | 50 parts by mass | 8 μm | No | 20 nm | 6 μm | Polycarbonate | $6.6 \times 10^{-5}$/K |
| Example 7 | 30° C. | 50 parts by mass | 8 μm | Yes | 20 nm | 20 μm | Polycarbonate | $6.6 \times 10^{-5}$/K |
| Example 8 | 30° C. | 5 parts by mass | 8 μm | Yes | 20 nm | 6 μm | Polycarbonate | $6.6 \times 10^{-5}$/K |
| Comparative Example 1 | 90° C. | 50 parts by mass | 8 μm | Yes | 20 nm | 6 μm | Polycarbonate | $6.6 \times 10^{-5}$/K |
| Comparative Example 2 | 15° C. | 50 parts by mass | 8 μm | Yes | 20 nm | 6 μm | Polycarbonate | $6.6 \times 10^{-5}$/K |

TABLE 3

|  | Light diffusion properties | Appearance | Primary adhesion | Secondary adhesion | Surface hardness | Scratch resistance |
|---|---|---|---|---|---|---|
| Example 1 | I | A | 100/100 | 100/100 | HB | Yes |
| Example 2 | I | A | 100/100 | 100/100 | HB | Yes |
| Example 3 | I | A | 100/100 | 100/100 | HB | Yes |
| Example 4 | I | A | 100/100 | 100/100 | HB | Yes |
| Example 5 | I | A | 100/100 | 100/100 | HB | Yes |
| Example 6 | II | B | 100/100 | 100/100 | HB | Yes |
| Example 7 | III | A | 100/100 | 100/100 | HB | Yes |
| Example 8 | I | C | 100/100 | 100/100 | HB | Yes |
| Comparative Example 1 | I | A | 100/100 | 0/100 | F | Yes |
| Comparative Example 2 | I | A | 100/100 | 100/100 | 2B | No |

Regarding light diffuser 1 of Comparative Example 1, because the glass transition temperature of 90° C. of the acrylic resin included in acrylic resin film 3 is high, a separation of the coated film is confirmed in the secondary adhesion test. Moreover, regarding light diffuser 1 of Comparative Example 2, because the glass transition temperature of 15° C. of the acrylic resin included in acrylic resin film 3 is low, the adhesion between thermoplastic resin base 2 and acrylic resin film 3 is ensured, but the surface hardness of acrylic resin film 3 is reduced, and the scratch resistance is reduced.

On the other hand, light diffusers 1 of Examples 1 to 8 produce superior results in all of the primary adhesion, secondary adhesion, surface hardness, and scratch resistance.

In Example 6, because the particulate acrylic resin includes not porous spherical particles hut non-porous spherical particles, and the specific surface area of the particles is reduced, the light diffusion properties and light transmission properties are slightly reduced.

In Example 7, because the thickness of acrylic resin film 3 is greater than the average particle size of acrylic resin particles 4, the irregularities in the surface are decreased, and the light transmission properties are slightly reduced.

In Example 8, the amount of acrylic resin particles 4 is small, the light diffusion properties are reduced, and the concealing characteristics for the light source image are slightly reduced.

As described above, by forming acrylic resin film 3 on one surface 21 of thermoplastic resin base 2 having the thermal expansion coefficient of at least $4 \times 10^{-5}$/K and at most $8 \times 10^{-5}$/K, using the acrylic resin having the glass transition temperature (Tg) of at least 30° C. and at most 50° C., it is possible to provide light diffuser 1 including acrylic resin film 3 having superior adhesion and durability, and luminaire 10. It is also possible to provide light diffuser 1 and luminaire 10 which make it possible to diffuse light efficiently.

While the foregoing has described one or more embodiments and/or other examples, it is understood that various modifications may be made therein and that the subject matter disclosed herein may be implemented in various forms and examples, and that they may be applied in numerous applications, only some of which have been described herein. It is intended by the following claims to claim any and all modifications and variations that fall within the true scope of the present teachings.

What is claimed is:

1. A light diffuser comprising:
   a thermoplastic resin base which has a thermal expansion coefficient of at least $4 \times 10^{-5}$/K and at most $8 \times 10^{-5}$/K; and
   a light diffusion layer which is disposed on a surface of the thermoplastic resin base and includes an acrylic resin film and an acrylic resin particle, the acrylic resin film including one or more acrylic resins having a glass transition temperature of at least 30° C. and at most 50° C., the acrylic resin particle being included in the acrylic resin film and having an average particle size of at least 1 μm and at most 15 μm.

2. The light diffuser according to claim 1, wherein the light diffusion layer includes at least 10 parts by mass and, at most 300 parts by mass of the acrylic resin particle with respect to a total of 100 parts by mass of the one or more acrylic resins.

3. The light diffuser according to claim 1, wherein the acrylic resin particle is a porous particle.

4. The light diffuser according to claim 3, wherein the porous particle has an average micropore size of at least 10 nm and at most 100 nm.

5. The light diffuser according to claim 1,
wherein the acrylic resin film has a thickness less than the average particle size of the acrylic resin particle.

6. The light diffuser according to claim 1,
wherein the thermoplastic resin base includes polycarbonate.

7. A luminaire comprising:
the light diffuser according to claim L and
a light-emitting diode (LED) light source,
wherein the light diffuser is disposed having a surface on a side of the thermoplastic resin base face the LED light source.

8. A luminaire comprising:
the light diffuser according to claim 1; and
a light-emitting diode (LED) light source,
wherein the light diffuser is disposed having a surface on a side of the light diffusion layer face the LED light source.

\* \* \* \* \*